United States Patent
Takahashi et al.

(10) Patent No.: US 8,498,144 B2
(45) Date of Patent: Jul. 30, 2013

(54) SEMICONDUCTOR STORAGE DEVICE

(75) Inventors: Masahiro Takahashi, Yokohama (JP);
Katsuyuki Fujita, Yokohama (JP);
Yoshihiro Ueda, Yokohama (JP);
Katsuhiko Hoya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 13/191,678

(22) Filed: Jul. 27, 2011

(65) Prior Publication Data

US 2012/0063215 A1  Mar. 15, 2012

(30) Foreign Application Priority Data

Sep. 10, 2010 (JP) .................. 2010-203345

(51) Int. Cl.
*G11C 11/00* (2006.01)
*G11C 11/15* (2006.01)
(52) U.S. Cl.
USPC ......... 365/158; 365/63; 365/148; 365/189.16
(58) Field of Classification Search
USPC .................................. 365/45, 100
See application file for complete search history.

(56) References Cited

U.S. PATENT DOCUMENTS

| | | | |
|---|---|---|---|
| 7,499,349 B2 * | 3/2009 | Roehr | 365/196 |
| 7,505,305 B2 * | 3/2009 | Hidaka | 365/158 |
| 7,505,307 B2 * | 3/2009 | Ueda | 365/158 |
| 8,228,710 B2 * | 7/2012 | Tsuchida | 365/148 |
| 2010/0009659 A1 | 1/2010 | Netanel et al. | |

FOREIGN PATENT DOCUMENTS

JP  2008-47220  2/2008

OTHER PUBLICATIONS

U.S. Appl. No. 12/847,892, filed Jul. 30, 2010, Katsuyuki Fujita.
Notification of Reason for Rejection issued Jan. 8, 2013 in Japanese Patent Application No. 2010-203345 (with English translation).

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A semiconductor storage device includes first to fourth switch circuits. The semiconductor storage device includes a row decoder which controls a voltage of a word line. The semiconductor storage device includes a first selection transistor of which a control terminal is connected to the word line. The semiconductor storage device includes a first resistance change element which is connected in series to the first selection transistor between the first bit line and the second bit line, and of which a resistance value changes according to a flowing current. The semiconductor storage device includes a second selection transistor of which a control terminal is connected to the word line. The semiconductor storage device includes a second resistance change element which is connected in series to the second selection transistor between the second bit line and the third bit line, and of which a resistance value changes according to a flowing current.

19 Claims, 3 Drawing Sheets

SEMICONDUCTOR STORAGE DEVICE

CROSS-REFERENCE TO RELATED APPLICATION

This application is based upon and claims the benefit of priority from the prior Japanese Patent Application No. 2010-203345, filed on Sep. 10, 2010, the entire contents of which are incorporated herein by reference.

BACKGROUND

1. Field

Embodiments described herein relate generally to a semiconductor storage device comprising resistance change elements.

2. Background Art

In recent years, semiconductor storage devices that use resistance change elements as memory cells have attracted attention as next-generation memories. For example, as devices that use magnetoresistive elements as memory cells, there are known a magnetoresistive random access memory (MRAM), a phase change random access memory (PRAM), and a resistive random access memory (ReRAM).

In the MRAM, a magnetoresistive element that is called a magnetic tunnel junction (MTJ) element is used as a storage element.

The MTJ element has a fixing layer where a magnetization direction is fixed by an antiferromagnetic layer, a recording layer that can freely reverse a magnetization direction, and an insulating film that is interposed between the fixing layer and the recording layer. The MTJ element uses a resistance change based on the relative magnetization direction of the recording layer with respect to the fixing layer, which is called a magnetoresistive effect.

That is, data of "1" and "0" are determined using the resistance difference based on the relative magnetization direction.

In particular, a spin injection type MRAM that uses magnetization inversion based on polarization spin current injection in a write method have attracted attention in recent years. In the spin injection type MRAM, the amount of current (inversion threshold current) that is needed to inverse magnetization is defined by the density of current flowing through the MTJ element.

A write operation of the spin injection type MRAM is executed by flowing a write current equal to or more than the inversion threshold current.

The polarity ("0" or "1") of the data is determined according to a write current injection direction with respect to the MTJ element.

DETAILED DESCRIPTION

Figure 1:
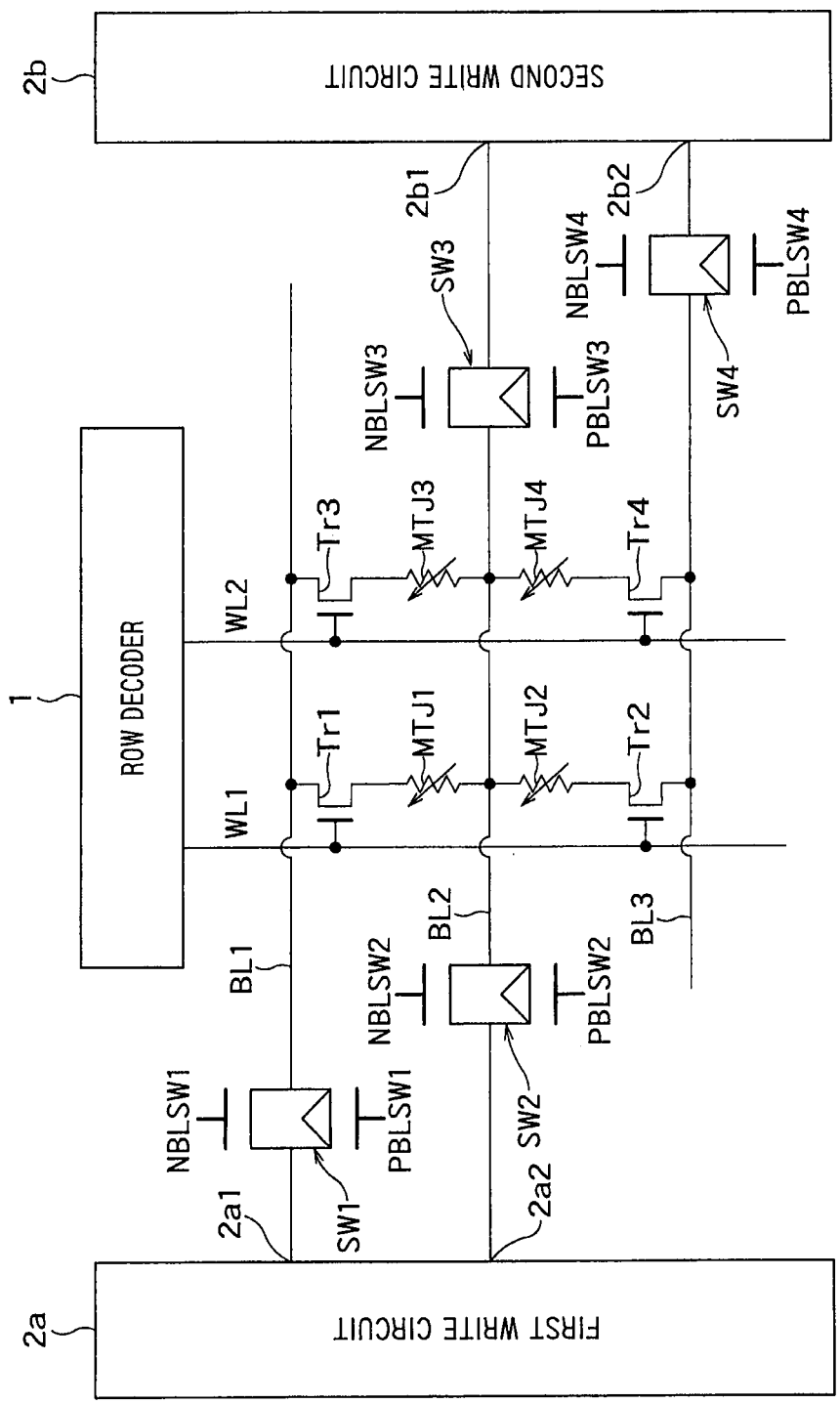
FIG. 1 is a diagram showing an example of the configuration of a semiconductor storage device 100 according to a first embodiment.

A semiconductor storage device according to an embodiment, includes a first switch circuit of which a first end is connected to a first end of a first bit line. The semiconductor storage device includes a second switch circuit of which a first end is connected to a first end of a second bit line. The semiconductor storage device includes a third switch circuit of which a first end is connected to a second end of the second bit line. The semiconductor storage device includes a fourth switch circuit of which a first end is connected to a first end of a third bit line. The semiconductor storage device includes a row decoder which controls a voltage of a word line. The semiconductor storage device includes a first write circuit of which a first signal terminal is connected to a second end of the first switch circuit, and of which a second signal terminal is connected to a second end of the second switch circuit. The semiconductor storage device includes a second write circuit of which a third signal terminal is connected to a second end of the third switch circuit, and of which a fourth signal terminal is connected to a second end of the fourth switch circuit. The semiconductor storage device includes a first selection transistor of which a control terminal is connected to the word line. The semiconductor storage device includes a first resistance change element which is connected in series to the first selection transistor between the first bit line and the second bit line, and of which a resistance value changes according to a flowing current. The semiconductor storage device includes a second selection transistor of which a control terminal is connected to the word line. The semiconductor storage device includes a second resistance change element which is connected in series to the second selection transistor between the second bit line and the third bit line, and of which a resistance value changes according to a flowing current.

When a write operation is executed, in a state where the row decoder controls the voltage applied to the word line to turn off the first and second selection transistors, the first, third, and fourth switch circuits are turned on to connect the first signal terminal and the first end of the first bit line to each other, the third signal terminal and the second end of the second bit line to each other, and the fourth signal terminal and the first end of the third bit line to each other; the second switch circuit is turned off to disconnect the second signal terminal and the first end of the second bit line from each other; the first write circuit applies to a first voltage to the first signal terminal; and the second write circuit applies a second voltage different from the first voltage to the third signal terminal and applies a third voltage different from the first voltage to the fourth signal terminal. Then, the fourth switch circuit is turned off to disconnect the fourth signal terminal and the first end of the third bit line from each other. Then, the row decoder controls the voltage applied to the word line to turn on the first and second selection transistors.

Hereafter, embodiments will be described more specifically with reference to the drawings.

First Embodiment

FIG. 1 is a diagram showing an example of the configuration of a semiconductor storage device 100 according to a first embodiment.

As shown in FIG. 1, the semiconductor storage device 100 (spin injection type MRAM) includes a row decoder 1, a first write circuit 2a, a second write circuit 2b, a first selection transistor Tr1, a second selection transistor Tr2, a third selection transistor Tr3, a fourth selection transistor Tr4, a first bit line BL1, a second bit line BL2, a third bit line BL3, word lines WL1 and WL2, a first switch circuit SW1, a second switch circuit SW2, a third switch circuit SW3, a fourth switch circuit SW4, a first resistance change element MTJ1, a second resistance change element MTJ2, a third resistance change element MTJ3, and a fourth resistance change element MTJ4.

One end of the first switch circuit SW1 is connected to one end of the first bit line BL1 and the other end thereof is connected to a first signal terminal 2a1. For example, the first switch circuit SW1 is a transmission gate and is ON/OFF-controlled by control signals NBLSW1 and PBLSW1.

One end of the second switch circuit SW2 is connected to one end of the second bit line BL2 and the other end thereof is connected to a second signal terminal 2a2. For example, the second switch circuit SW2 is a transmission gate and is ON/OFF-controlled by control signals NBLSW2 and PBLSW2.

One end of the third switch circuit SW3 is connected to the other end of the second line BL2 and the other end thereof is connected to a third signal terminal 2b1. For example, the third switch circuit SW3 is a transmission gate and is ON/OFF-controlled by control signals NBLSW3 and PBLSW3.

One end of the fourth switch circuit SW4 is connected to one end of the third bit line BL3 and the other end thereof is connected to a fourth signal terminal 2b2. For example, the fourth switch circuit SW4 is a transmission gate and is ON/OFF-controlled by control signals NBLSW4 and PBLSW4.

In this case, the control signals NBLSW1 to NBLSW4 and PBLSW1 to PBLSW4 are generated by decoding externally input address signals by a decoder (not shown in the drawings). That is, the first to fourth switch circuits SW1 to SW4 are controlled according to the externally input address signals.

The row decoder 1 controls voltages of the word lines WL1 and WL2.

The first signal terminal 2a1 of the first write circuit 2a is connected to the other end of the first switch circuit SW1 and the second signal terminal 2a2 is connected to the other end of the second switch circuit SW2. The first write circuit 2a applies a predetermined voltage (current) to the first and second signal terminals 2a1 and 2a2, when a write operation is executed.

The third signal terminal 2b1 of the second write circuit 2b is connected to the other end of the third switch circuit SW3 and the fourth signal terminal 2b2 is connected to the other end of the fourth switch circuit SW4. The second write circuit 2b applies a predetermined voltage (current) to the third and fourth signal terminals 2b1 and 2b2, when a write operation is executed.

The first selection transistor Tr1 is a MOS transistor of which a control terminal (gate) is connected to the word line WL1

The first resistance change element MTJ1 is connected in series to the first selection transistor Tr1 between the first bit line BL1 and the second bit line BL2. A resistance value of the first resistance change element MTJ1 is changed according to a flowing current.

In this embodiment, one end (source) of the first selection transistor Tr1 is connected to the first bit line BL1. The first resistance change element MTJ1 is connected between the other end (drain) of the first selection transistor Tr1 and the second bit line BL2.

The first selection transistor Tr1 and the first resistance change element MTJ1 constitute a cell unit.

The second selection transistor Tr2 is a MOS transistor of which a control terminal (gate) is connected to the word line WL1

The second resistance change element MTJ2 is connected in series to the second selection transistor Tr2 between the second bit line BL2 and the third bit line BL3. A resistance value of the second resistance change element MTJ2 is changed according to a flowing current.

In this embodiment, one end (source) of the second selection transistor Tr2 is connected to the third bit line BL3. The second resistance change element MTJ2 is connected between the other end (drain) of the second selection transistor Tr2 and the second bit line BL2.

The second selection transistor Tr2 and the second resistance change element MTJ2 constitute a cell unit.

The third selection transistor Tr3 is a MOS transistor of which a control terminal (gate) is connected to the word line WL2.

The third resistance change element MTJ3 is connected in series to the third selection transistor Tr3 between the first bit line BL1 and the second bit line BL2. A resistance value of the third resistance change element MTJ3 is changed according to a flowing current.

In this embodiment, one end (source) of the third selection transistor Tr3 is connected to the first bit line BL1. The third resistance change element MTJ3 is connected between the other end (drain) of the third selection transistor Tr3 and the second bit line BL2.

The third selection transistor Tr3 and the third resistance change element MTJ3 constitute a cell unit.

The fourth selection transistor Tr4 is a MOS transistor of which a control terminal (gate) is connected to the word line WL2.

The fourth resistance change element MTJ4 is connected in series to the fourth selection transistor Tr4 between the second bit line BL2 and the third bit line BL3. A resistance value of the fourth resistance change element MTJ4 is changed according to a flowing current.

In this embodiment, one end (source) of the fourth selection transistor Tr4 is connected to the third bit line BL3. The fourth resistance change element MTJ4 is connected between the other end (drain) of the fourth selection transistor Tr4 and the second bit line BL2.

The fourth selection transistor Tr4 and the fourth resistance change element MTJ4 constitute a cell unit.

By the four cell units described above, a memory cell array of the semiconductor storage device 100 is configured.

In this case, each of the first to fourth resistance change elements MTJ1 to MTJ4 is a magnetoresistive element (in particular, MTJ element).

That is, each of the first to fourth resistance change elements MTJ1 to MTJ4 has a first resistance value when a current flows which has a first polarity and is equal to or more than a first inversion threshold current, and has a second resistance value when a current flows which has a second polarity different from the first polarity and is equal to or more than a second inversion threshold current.

Next, some examples of the write operation of the semiconductor storage device 100 that has the above-described configuration will be described.

First, an example of the write operation with respect to the first resistance change element MTJ1 of the semiconductor storage device 100 will be described. That is, the first resistance change element MTJ1 is selected and the second to fourth resistance change elements MTJ2 to MTJ4 are not selected.

Figure 2:
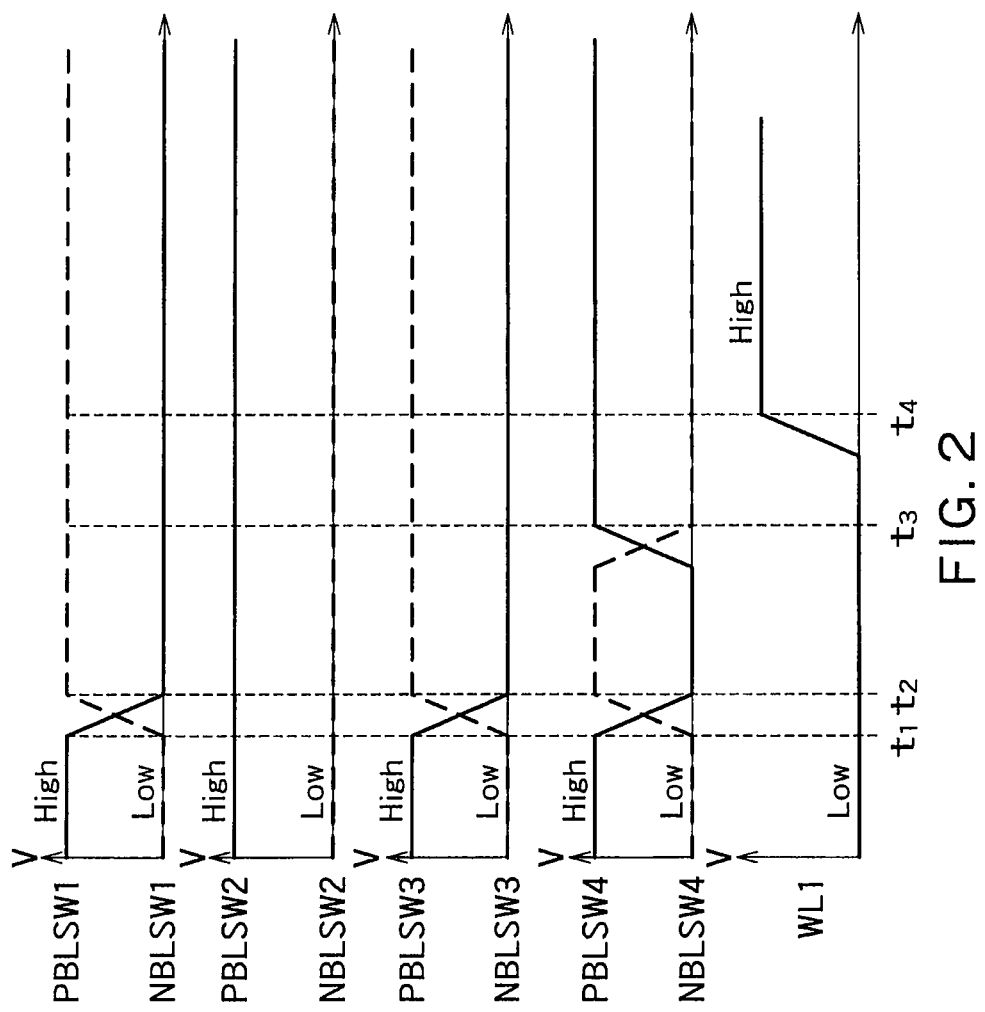
FIG. 2 is a waveform diagram showing an example of a waveform of each signal of the memory cell array of the semiconductor storage device 100 shown in FIG. 1.

FIG. 2 is a waveform diagram showing an example of a waveform of each signal of the memory cell array of the semiconductor storage device 100 shown in FIG. 1.

When the write operation is executed, as shown in FIG. 2, in an initial state (until time t1), the control signals NBLSW1 to NBLSW4 are maintained at a "Low" level according to the address signals (control signals PBLSW1 to PBLSW4 are maintained at a "High" level). Thereby, the first to fourth switch circuits SW1 to SW4 are turned off.

The row decoder 1 controls the voltage that is applied to the word lines WL1 and WL2 (to become a "Low" level) and turns off the first to fourth selection transistors Tr1 to Tr4.

Next, in a state where the first and second selection transistors Tr1 and Tr2 are turned off, at a time t2, the levels of the control signals NBLSW1, NBLSW3, and NBLSW4 change to a "High" level according to the address signals (levels of the control signals PBLSW1, PBLSW3, and PBLSW4 change to a "Low" level).

Thereby, the first, third, and fourth switch circuits SW1, SW3, and SW4 are turned on and the first signal terminal 2a1 and one end of the first bit line BL1, the third signal terminal 2b1 and the other end of the second bit line BL2, and the fourth signal terminal 2b2 and one end of the third bit line BL3 are connected. Further, the second switch circuit SW2 remains in the off state and the second signal terminal 2a2 and one end of the second bit line BL2 remain disconnected.

The first write circuit 2a applies a first voltage to the first signal terminal 2a1. The second write circuit 2b applies a second voltage different from the first voltage to the third signal terminal 2b1 and applies a third voltage different from the first voltage to the fourth signal terminal 2b2.

Thereby, the voltages of the first to third bit lines BL1, BL2, and BL3 ideally become the first voltage, the second voltage, and the third voltage, respectively. However, in practice, the voltages of the first to third bit lines BL1, BL2, and BL3 may be different from the first voltage, the second voltage, and the third voltage, due to the wiring capacitance or the voltage drop of the circuit. In this embodiment, the second voltage is set to be equal to the third voltage.

Then, at a time t3, the level of the control signal NBLSW4 changes to a "Low" level according to the address signal (level of the control signal PBLSW4 changes to a "High" level). Thereby, the fourth switch circuit SW4 is turned off and the fourth signal terminal 2b2 and one end of the third bit line BL3 are disconnected. That is, a path from the third bit line BL3 to the second write circuit 2b via the fourth switch circuit SW4 is cut.

Then, at a time t4, the row decoder 1 controls the voltage that is applied to the word line WL1 (to become a "High" level) and turns on the first and second selection transistors Tr1 and Tr2.

As a result, the current of a first polarity, which is equal to or more than the first inversion threshold current, flows to the first resistance change element MTJ1 as a selected cell, by the electric potential difference of the first voltage and the second voltage. That is, the resistance value of the first resistance change element MTJ1 becomes the first resistance value.

Meanwhile, since the path from the third bit line BL3 to the second write circuit 2b via the fourth switch circuit SW4 is cut, a current does not flow to the second resistance change element MTJ2 as a non-selected cell. That is, the resistance value of the second resistance change element MTJ2 does not change.

During the write operation, since the row decoder 1 maintains the electric potential of the word line WL2 at a "Low" level, the third and fourth selection transistors Tr3 and Tr4 are maintained in an OFF state and a current does not flow to the third and fourth resistance change elements TMJ3 and TMJ4 as non-selected cells. That is, data is not written in the third and fourth resistance change elements TMJ3 and TMJ4 as non-selected cells.

As described above, before the first and second selection transistors Tr1 and Tr2 are turned on by controlling the voltage of the word line WL1, the forth switch circuit SW4 that is connected to the third bit line BL3 is turned off. Thereby, the current is not allowed to flow to the second resistance change element MTJ2 as a non-selected cell and erroneous data write can be suppressed.

Next, another example of the write operation of the semiconductor storage device 100 will be described. In this case, an example of the write operation with respect to the second resistance change element MTJ2 of the semiconductor storage device 100 will be described. That is, the second resistance change element MTJ2 is selected and the first, third, and fourth resistance change elements MTJ1, MTJ3, and MTJ4 are not selected.

Figure 3:
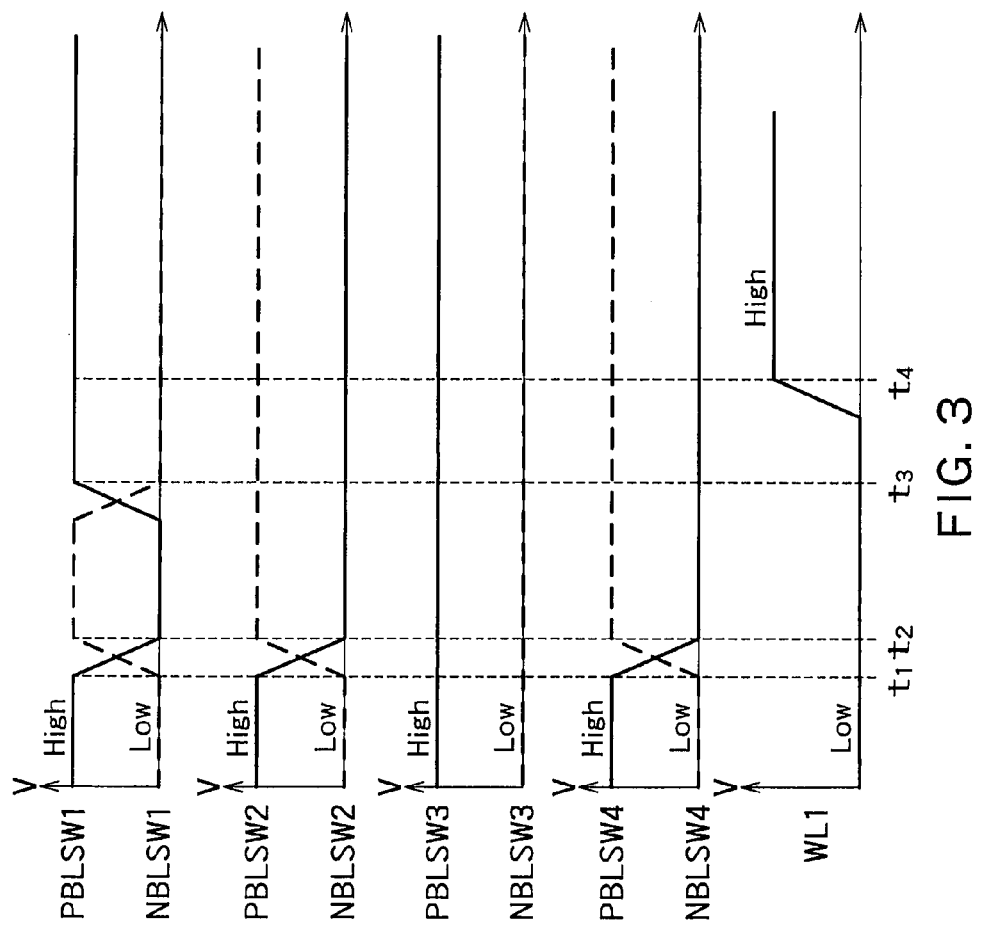
FIG. 3 is a waveform diagram showing another example of a waveform of each signal of the memory cell array of the semiconductor storage device 100 shown in FIG. 1.

FIG. 3 is a waveform diagram showing another example of a waveform of each signal of the memory cell array of the semiconductor storage device 100 shown in FIG. 1.

When the write operation is executed, as shown in FIG. 3, in an initial state (until time t1), the control signals NBLSW1 to NBLSW4 are maintained at a "Low" level according to the address signals (control signals PBLSW1 to PBLSW4 are maintained at a "High" level). Thereby, the first to fourth switch circuits SW1 to SW4 are turned off.

The row decoder 1 controls the voltage that is applied to the word lines WL1 and WL2 (to become a "Low" level) and turns off the first to fourth selection transistors Tr1 to Tr4.

Next, in a state where the first and second selection transistors Tr1 and Tr2 remains in the off state, at a time t2, the levels of the control signals NBLSW1, NBLSW2, and NBLSW4 change to a "High" level according to the address signals (levels of the control signals PBLSW1, PBLSW2, and PBLSW4 change to a "Low" level).

Thereby, the first, second, and fourth switch circuits SW1, SW2, and SW4 are turned on and the first signal terminal 2a1 and one end of the first bit line BL1, the second signal terminal 2a2 and the other end of the second bit line BL2, and the fourth signal terminal 2b2 and one end of the third bit line BL3 are connected. Further, the third switch circuit SW3 remains in the off state and the third signal terminal 2b1 and the other end of the second bit line BL2 remain disconnected.

The first write circuit 2a applies the third voltage to the first signal terminal 2a1 and applies the second voltage to the second signal terminal 2a2. The second write circuit 2b applies the first voltage to the fourth signal terminal 2b2.

Thereby, the voltages of the first to third bit lines BL1, BL2, and BL3 ideally become the third voltage, the second voltage, and the first voltage, respectively. However, in practice, the voltages of the first to third bit lines BL1, BL2, and BL3 may be different from the third voltage, the second voltage, and the first voltage, due to the wiring capacitance or the voltage drop of the circuit. In this embodiment, the second voltage is set to be equal to the third voltage.

Then, at a time t3, the level of the control signal NBLSW1 changes to a "Low" level according to the address signal (level of the control signal PBLSW1 changes to a "High" level). Thereby, the first switch circuit SW1 is turned off and the first signal terminal 2a1 and one end of the first bit line BL1 are disconnected. That is, a path from the first bit line BL1 to the first write circuit 2a via the first switch circuit SW1 is cut.

Then, at a time t4, the row decoder 1 controls the voltage that is applied to the word line WL1 (to become a "High" level) and turns on the first and second selection transistors Tr1 and Tr2.

As a result, the current of a first polarity, which is equal to or more than the first inversion threshold current, flows to the second resistance change element MTJ2 as a selected cell, by the electric potential difference of the first voltage and the second voltage. That is, the resistance value of the second resistance change element MTJ2 becomes the second resistance value.

Meanwhile, since the path from the first bit line BL1 to the first write circuit 2a via the first switch circuit SW1 is cut, a current does not flow to the first resistance change element MTJ1 as a non-selected cell. That is, the resistance value of the first resistance change element MTJ1 does not change.

During the write operation, since the row decoder 1 maintains the electric potential of the word line WL2 at a "Low" level, the third and fourth selection transistors Tr3 and Tr4 are maintained in an OFF state and a current does not flow to the third and fourth resistance change elements TMJ3 and TMJ4 as non-selected cells. That is, data is not written in the third and fourth resistance change elements TMJ3 and TMJ4 as non-selected cells.

As described above, before the first and second selection transistors Tr1 and Tr2 are turned on by controlling the voltage of the word line WL1, the first switch circuit SW1 that is connected to the first bit line BL1 is turned off. Thereby, the current is not allowed to flow to the first resistance change element MTJ1 as a non-selected cell and erroneous data write can be suppressed.

That is, according to the semiconductor storage device according to the first embodiment, an influence on non-selected cells by the write operation of the selected cells can be reduced.

In the example of the semiconductor storage device 100 shown in FIG. 1, the memory cell array is configured by the four cell units. However, the present invention can be applied to a semiconductor storage device that includes a memory cell array having more than four cell units. In this case, the same function and effect can be achieved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a first memory cell configured to a first selection transistor and a first resistance change element of which a resistance value changes according to a flowing current;
a second memory cell configured to a second selection transistor and a second resistance change element of which a resistance value changes according to a flowing current;
a first bit line connected to a first end of the first memory cell;
a second bit line connected to a second end of the first memory cell and a second end of the second memory cell;
a third bit line connected to a first end of the second memory cell;
a word line electrically connected to a control terminal of the first and second selection transistor;
a row decoder electrically connected to a word line and which controls a voltage of the word line;
a write circuit electrically connected to the first bit line, the second bit line, and the third bit line, and which controls a voltage of the bit lines respectively;
a plurality of switch circuits electrically connected between the write circuit and the memory cells;
wherein, when a write operation is executed, the row decoder controls the voltage applied to the word line to turn on the first selection transistors after the first memory cell connects the write circuit and the second memory cell disconnects the write circuit on the basis of the switch circuits.

2. The semiconductor storage device of claim 1, wherein each of the first and second resistance change elements has a first resistance value, when a current flows which has a first polarity and is equal to or more than a first inversion threshold current, and has a second resistance value, when a current flows which has a second polarity different from the first polarity and is equal to or more than a second inversion threshold current.

3. The semiconductor storage device of claim 1, wherein a first end of the first selection transistor is connected to the first bit line,
the first resistance change element is connected between a second end of the first selection transistor and the second bit line,
a first end of the second selection transistor is connected to the third bit line, and
the second resistance change element is connected between a second end of the second selection transistor and the second bit line.

4. The semiconductor storage device of claim 2, wherein a first end of the first selection transistor is connected to the first bit line,
the first resistance change element is connected between a second end of the first selection transistor and the second bit line,
a first end of the second selection transistor is connected to the third bit line, and
the second resistance change element is connected between a second end of the second selection transistor and the second bit line.

5. The semiconductor storage device of claim 4, wherein the first resistance change element and the second resistance change element are MTJ (magnetic tunnel junction) element.

6. A semiconductor storage device, comprising:
a first switch circuit of which a first end is connected to a first end of a first bit line;
a second switch circuit of which a first end is connected to a first end of a second bit line;
a third switch circuit of which a first end is connected to a second end of the second bit line;
a fourth switch circuit of which a first end is connected to a first end of a third bit line;
a row decoder which controls a voltage of a word line;
a first write circuit of which a first signal terminal is connected to a second end of the first switch circuit, and of which a second signal terminal is connected to a second end of the second switch circuit;
a second write circuit of which a third signal terminal is connected to a second end of the third switch circuit, and of which a fourth signal terminal is connected to a second end of the fourth switch circuit;
a first selection transistor of which a control terminal is connected to the word line;
a first resistance change element which is connected in series to the first selection transistor between the first bit line and the second bit line, and of which a resistance value changes according to a flowing current;
a second selection transistor of which a control terminal is connected to the word line; and
a second resistance change element which is connected in series to the second selection transistor between the second bit line and the third bit line, and of which a resistance value changes according to a flowing current,
wherein, when a write operation is executed,
in a state where the row decoder controls the voltage applied to the word line to turn off the first and second selection transistors, the first, third, and fourth switch circuits are turned on to connect the first signal terminal and the first end of the first bit line to each other, the third signal terminal and the second end of the second bit line to each other, and the fourth signal terminal and the first end of the third bit line to each other; the second switch circuit is turned off to disconnect the second signal terminal and the first end of the second bit line from each other; the first write circuit applies to a first voltage to the first signal terminal; and the second write circuit applies a second voltage different from the first voltage to the third signal terminal and applies a third voltage different from the first voltage to the fourth signal terminal,
then, the fourth switch circuit is turned off to disconnect the fourth signal terminal and the first end of the third bit line from each other, and
then, the row decoder controls the voltage applied to the word line to turn on the first and second selection transistors.

7. The semiconductor storage device of claim 6, wherein the second voltage is equal to the third voltage.

8. The semiconductor storage device of claim 7,
wherein each of the first and second resistance change elements has a first resistance value, when a current flows which has a first polarity and is equal to or more than a first inversion threshold current, and has a second resistance value, when a current flows which has a second polarity different from the first polarity and is equal to or more than a second inversion threshold current.

9. The semiconductor storage device of claim 8, wherein the current of a first polarity, which is equal to or more than the first inversion threshold current, flows to the first resistance change element, by an electric potential difference of the first voltage and the second voltage.

10. The semiconductor storage device of claim 9, wherein
a first end of the first selection transistor is connected to the first bit line,
the first resistance change element is connected between a second end of the first selection transistor and the second bit line,
a first end of the second selection transistor is connected to the second bit line, and
the second resistance change element is connected between a second end of the second selection transistor and the third bit line.

11. The semiconductor storage device of claim 10, wherein the first resistance change element and the second resistance change element are magnetoresistive elements.

12. The semiconductor storage device of claim 11, wherein the magnetoresistive element is a MTJ (magnetic tunnel junction) element.

13. The semiconductor storage device of claim 8, wherein
a first end of the first selection transistor is connected to the first bit line,
the first resistance change element is connected between a second end of the first selection transistor and the second bit line,
a first end of the second selection transistor is connected to the second bit line, and
the second resistance change element is connected between a second end of the second selection transistor and the third bit line.

14. The semiconductor storage device of claim 7, wherein
a first end of the first selection transistor is connected to the first bit line,
the first resistance change element is connected between a second end of the first selection transistor and the second bit line,
a first end of the second selection transistor is connected to the second bit line, and
the second resistance change element is connected between a second end of the second selection transistor and the third bit line.

15. The semiconductor storage device of claim 6,
wherein each of the first and second resistance change elements has a first resistance value, when a current flows which has a first polarity and is equal to or more than a first inversion threshold current, and has a second resistance value, when a current flows which has a second polarity different from the first polarity and is equal to or more than a second inversion threshold current.

16. The semiconductor storage device of claim 15, wherein the current of a first polarity, which is equal to or more than the first inversion threshold current, flows to the first resistance change element, by an electric potential difference of the first voltage and the second voltage.

17. The semiconductor storage device of claim 16, wherein
a first end of the first selection transistor is connected to the first bit line,
the first resistance change element is connected between a second end of the first selection transistor and the second bit line,
a first end of the second selection transistor is connected to the second bit line, and
the second resistance change element is connected between a second end of the second selection transistor and the third bit line.

18. The semiconductor storage device of claim 6, wherein
a first end of the first selection transistor is connected to the first bit line,
the first resistance change element is connected between a second end of the first selection transistor and the second bit line,
a first end of the second selection transistor is connected to the second bit line, and
the second resistance change element is connected between a second end of the second selection transistor and the third bit line.

19. The semiconductor storage device of claim 15, wherein
a first end of the first selection transistor is connected to the first bit line,
the first resistance change element is connected between a second end of the first selection transistor and the second bit line, a first end of the second selection transistor is connected to the second bit line, and the second resistance change element is connected between a second end of the second selection transistor and the third bit line.

\* \* \* \* \*